US009540727B2

(12) United States Patent
Kameda et al.

(10) Patent No.: US 9,540,727 B2
(45) Date of Patent: Jan. 10, 2017

(54) CLEANING METHOD, METHOD OF MANUFACTURING SEMICONDUCTOR DEVICE, SUBSTRATE PROCESSING APPARATUS AND RECORDING MEDIUM

(71) Applicants: HITACHI KOKUSAI ELECTRIC INC., Tokyo (JP); L'AIR LIQUIDE, SOCIETE ANONYME POUR L'ETUDE ET L'EXPLOITATION DES PROCEDES GEORGES CLAUDE, Paris (FR)

(72) Inventors: Kenji Kameda, Toyama (JP); Jun Sonobe, Tsukuba (JP); Yudai Tadaki, Tsukuba (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 5 days.

(21) Appl. No.: 14/192,165

(22) Filed: Feb. 27, 2014

(65) Prior Publication Data
US 2014/0248783 A1 Sep. 4, 2014

(30) Foreign Application Priority Data
Mar. 1, 2013 (JP) .................... 2013-040613

(51) Int. Cl.
H01L 21/31 (2006.01)
C23C 16/44 (2006.01)
H01L 21/02 (2006.01)

(52) U.S. Cl.
CPC ....... *C23C 16/4405* (2013.01); *H01L 21/0217* (2013.01); *H01L 21/02211* (2013.01); *H01L 21/02271* (2013.01)

(58) Field of Classification Search
CPC .................... H01L 21/02041; H01L 21/02334
USPC ................................. 438/758, 905
See application file for complete search history.

(56) References Cited

U.S. PATENT DOCUMENTS

| | | | | |
|---|---|---|---|---|
| 3,006,908 A | * | 10/1961 | Dye | 526/106 |
| 2003/0143846 A1 | * | 7/2003 | Sekiya et al. | 438/689 |
| 2005/0279382 A1 | * | 12/2005 | Hockele et al. | 134/2 |
| 2008/0236483 A1 | * | 10/2008 | Sonobe et al. | 118/70 |
| 2011/0259370 A1 | * | 10/2011 | Kameda et al. | 134/22.1 |

FOREIGN PATENT DOCUMENTS

| | | |
|---|---|---|
| JP | 2010-522985 A | 7/2010 |
| JP | 2011-233570 A | 11/2011 |
| WO | 2008/117258 A2 | 10/2008 |

* cited by examiner

*Primary Examiner* — Brook Kebede
(74) *Attorney, Agent, or Firm* — Volpe and Koenig, P.C.

(57) ABSTRACT

A cleaning method includes: providing a process container in which a process of forming a film on a substrate is performed; and removing a deposit including the film adhered to the process container by supplying a cleaning gas into the process container after performing the process. The act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

14 Claims, 6 Drawing Sheets

__US 9,540,727 B2__

CLEANING METHOD, METHOD OF MANUFACTURING SEMICONDUCTOR DEVICE, SUBSTRATE PROCESSING APPARATUS AND RECORDING MEDIUM

CROSS-REFERENCE TO RELATED APPLICATION

This application is based upon and claims the benefit of priority from Japanese Patent Application No. 2013-40613, filed on Mar. 1, 2013, the entire contents of which are incorporated herein by reference.

TECHNICAL FIELD

The present disclosure relates to a cleaning method, a method of manufacturing a semiconductor device, a substrate processing apparatus and a recording medium.

BACKGROUND

A process of forming a thin film on a substrate in a process container of a substrate processing apparatus may be performed in manufacturing a semiconductor device. Subsequently, a cleaning process of supplying a cleaning gas into the process container and etching away deposits including thin films deposited in the process container may be performed. An example of the cleaning gas may include a fluorine ($F_2$) gas. The $F_2$ gas can be used to remove deposits since it has an extremely high reactivity to allow the cleaning process to be easily performed through pyrolysis.

However, in order to use the $F_2$ gas to etch a deposit including, for example, a silicon nitride ($Si_3N_4$, simply SiN) film formed by thermal CVD (Chemical Vapor Deposition) at a practical speed, there is a need to heat the process container to a relatively high temperature. In this case, while the deposit formed in the process container is etched, a quartz ($SiO_2$) member in the process container may also be etched.

To overcome this problem, it is considered that a mixture of $F_2$ gas and nitrogen monoxide (NO) gas is used as the cleaning gas. The mixture of $F_2$ gas and NO gas can prevent the quartz member from being etched since the deposit can be etched with the process container held at a relatively low temperature, as compared to the case where the $F_2$ gas is used alone.

However, from careful studies by the present inventors, it has proved that the mixture of the $F_2$ gas and the NO gas may generate exothermic energy by reaction of these gases and components of a substrate processing apparatus may be damaged by this exothermic reaction. For example, when the $F_2$ gas and the NO gas are mixed in a gas supply pipe and are supplied into a process container, the exothermic reaction is produced in the gas supply pipe, which may result in corrosion of the gas supply pipe. In addition, if the $F_2$ gas and the NO gas are separately supplied into the process container and mixed in the process container, a local exothermic reaction is produced in the process container, which may result in a partially etched quartz member in the process container. In both cases, particles such as corrosion products or the like may be transported into a process chamber along with the gases and particles such as quartz powders and so on may be produced in the process chamber, which may lead to product defects. These problems are first revealed by the careful studies of the present inventors.

SUMMARY

The present disclosure provides some embodiments of a cleaning method which is capable of shortening time required to remove a deposit including a film deposited in a process container and reducing damage suffered by components of a substrate processing apparatus, a method of manufacturing a semiconductor device, a substrate processing apparatus and a recording medium.

According to one embodiment of the present disclosure, a cleaning method includes: providing a process container in which a process of forming a film on a substrate is performed; and removing a deposit including the film adhered to an interior of the process container by supplying a cleaning gas into the process container after performing the process, wherein the act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

According to another embodiment of the present disclosure, a method of manufacturing a semiconductor device includes: performing a process of forming a film on a substrate in a process container; and removing a deposit including the film adhered to an interior of the process container by supplying a cleaning gas into the process container after performing the process, wherein the act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

According to another embodiment of the present disclosure, a substrate processing apparatus includes: a process container in which a process of forming a film on a substrate is performed; a fluorine-containing gas supply system configured to supply a fluorine-containing gas; a nitrogen monoxide gas supply system configured to supply a nitrogen monoxide gas; a mixture part configured to mix and react the fluorine-containing gas with the nitrogen monoxide gas; an energy removal mechanism configured to remove exothermic energy generated by the reaction; and a control part configured to control the fluorine-containing gas supply system, the nitrogen monoxide gas supply system and the energy removal mechanism to generate a mixture gas of the fluorine-containing gas and a nitrosyl fluoride gas as a cleaning gas by mixture and reaction of the fluorine-containing gas supplied from the fluorine-containing gas supply system and the nitrogen monoxide gas supplied from the nitrogen monoxide gas supply system in the mixture part and supply the mixture gas from the mixture part into the process container after removing exothermic energy generated by the reaction by means of the energy removal mechanism, such that a deposit including the film adhered to an interior of the process container is removed.

According to another embodiment of the present disclosure, there is provided a non-transitory computer-readable recording medium storing a program that causes a computer to perform a process of: performing a process of forming a film on a substrate in a process container; and removing a deposit including the film adhered to an interior of the process container by supplying a cleaning gas into the process container after performing the film forming process, wherein the act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

DETAILED DESCRIPTION

Embodiment

Figure 1:
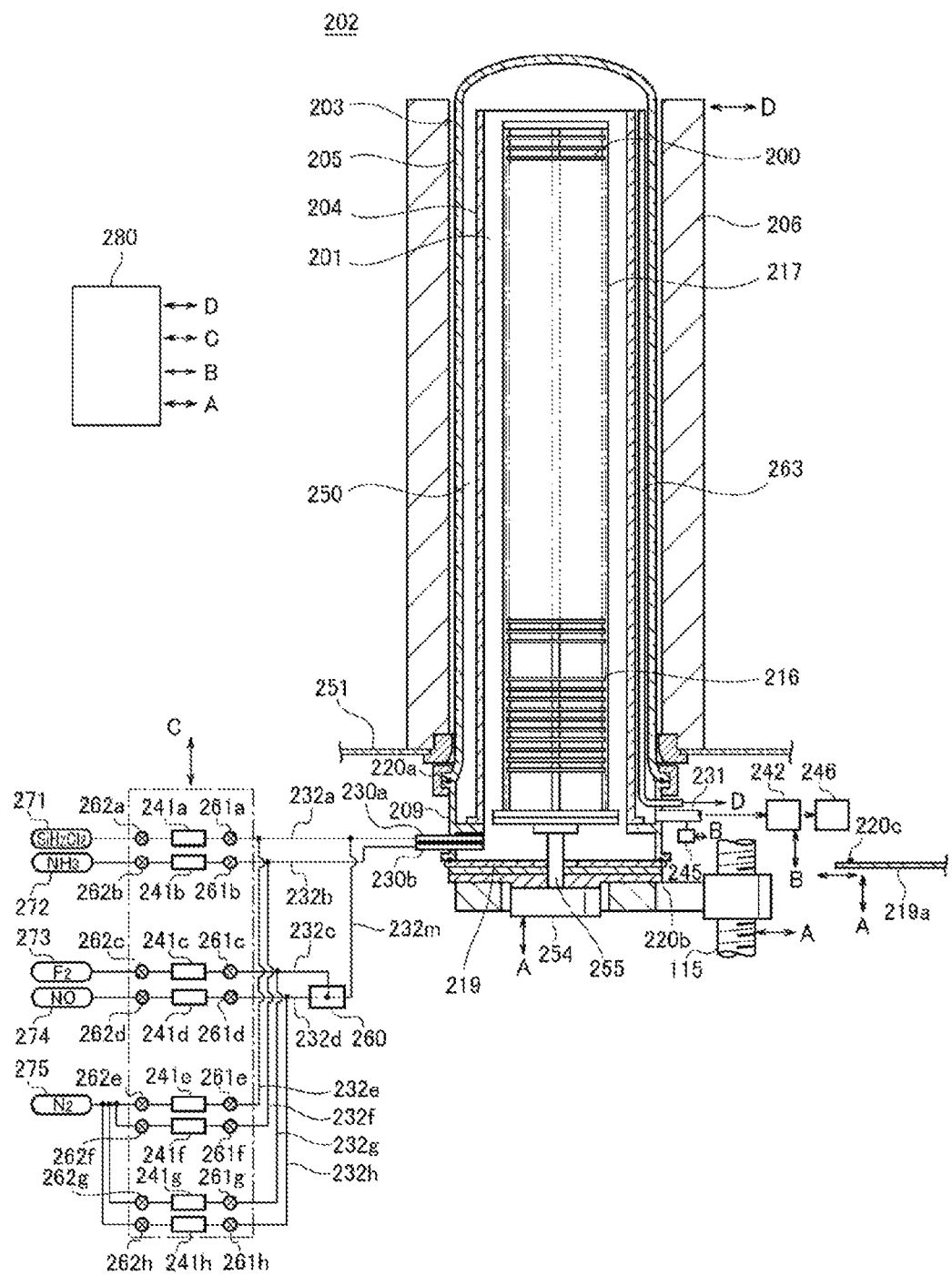
FIG. 1 is a schematic view illustrating a configuration of a vertical treatment furnace of a substrate processing apparatus according to some embodiments.

One embodiment of the present disclosure will now be described in detail with reference to the drawings.
(1) Configuration of Substrate Processing Apparatus A configuration of a substrate processing apparatus according to one embodiment will be first described with reference to the drawings. FIG. 1 is a schematic view illustrating a configuration of a vertical treatment furnace 202 of the substrate processing apparatus, in which a portion of the treatment furnace 202 is shown by a longitudinal sectional view.

As shown in FIG. 1, the vertical treatment furnace 202 has a heater 206 as a heating means (heating mechanism). The heater 206 has a cylindrical shape and is supported by a heater base 251 serving as a support plate so as to be vertically arranged. The heater 206 acts as an activation mechanism (excitation unit) to activate gas with heat.

A process tube 203 serving as a reaction tube is disposed inside the heater 206 in a concentric form along the heater 206. The process tube 203 includes an inner tube 204 serving as an inner reaction tube and an outer tube 205 serving as an outer reaction tube disposed outside of the inner tube 204. The inner tube 204 is made of a heat-resistant material such as, for example, quartz ($SiO_2$), silicon carbide (SiC) or the like and has a cylindrical shape with its upper and lower ends opened. A process chamber 201 is formed in a hollow of the inner tube 204 in which films are formed on wafers 200 serving as substrates. The process chamber 201 is configured to accommodate the wafers 200 with them horizontally stacked in multiple stages to be aligned in a vertical direction in a boat 217 which will be described later. The outer tube 205 is made of a heat-resistant material such as, for example, quartz, silicon carbide or the like and has its inner diameter larger than the outer diameter of the inner tube 204. The outer tube 205 has a cylindrical shape with its upper end blocked and its lower end opened and is provided in concentricity with the inner tube 204.

A manifold 209 is disposed below the outer tube 205 in concentricity with the outer tube 205. The manifold 209 is made of, for example, stainless steel or the like and has a cylindrical shape with its upper and lower ends opened. The manifold 209 is in engagement with the inner tube 204 and the outer tube 205 and is installed to support these tubes. In addition, an O-ring 220a serving as a seal member is installed between the manifold 209 and the outer tube 205. As the manifold 209 is supported to the heater base 251, the process tube 203 is in a vertical position. A process container (reaction container) in which films are formed on the wafers 200 is mainly constituted by the process tube 203 and the manifold 209.

The manifold 209 is connected with nozzles 230a and 230b serving as gas introduction units to communicate with the process chamber 201. The nozzles 230a and 230b are respectively connected with process gas supply pipes 232a and 232b to supply a process gas used for film formation into the process chamber 201. The process gas supply pipe 232a is connected with a $SiH_2Cl_2$ (DCS) gas source 271 serving as a first process gas source via a mass flow controller (MFC) 241a serving as a gas flow rate controller. Valves 262a and 261a are respectively installed in the upstream and downstream sides of the process gas supply pipe 232a from the MFC 241a. The process gas supply pipe 232b is connected with a $NH_3$ gas source 272 serving as a second process gas source via a mass flow controller (MFC) 241b serving as a gas flow rate controller. Valves 262b and 261b are respectively installed in the upstream and downstream sides of the process gas supply pipe 232b from the MFC 241b.

A process gas supply system is mainly constituted by the process gas supply pipes 232a and 232b, the MFCs 241a and 241b and the valves 262a, 261a, 262b and 261b. It may also be considered that the nozzles 230a and 230b, the $SiH_2Cl_2$ (DCS) gas source 271 and the $NH_3$ gas source 272 are included in the process gas supply system.

Figure 3A:
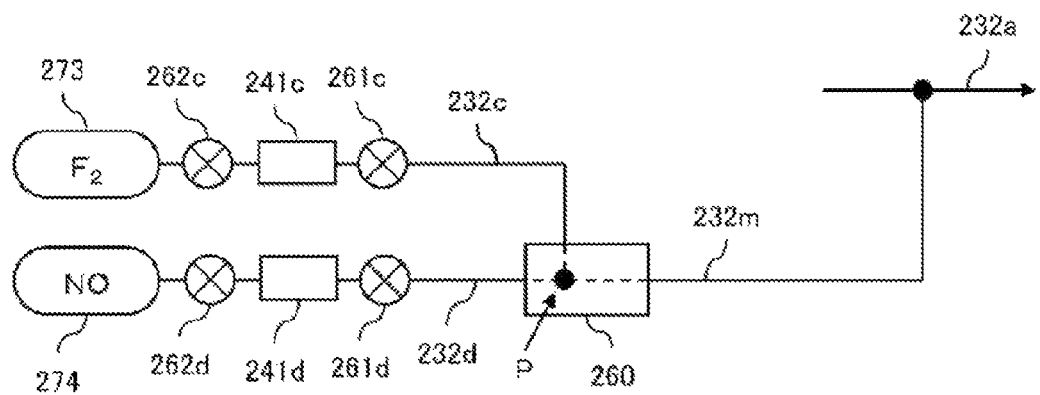
FIG. 3A is a partially-enlarged view of a mixture part and its surrounding area in the substrate processing apparatus according to some embodiments and FIGS. 3B to 3D are partially-enlarged views of a mixture part and its surrounding area according to modifications thereof.

A mixture gas supply pipe (cleaning gas supply pipe) 232m is connected to the downstream side of the process gas supply pipe 232a from the valve 261a. The mixture gas supply pipe 232m is connected with a fluorine-containing gas supply pipe 232c and a nitrogen monoxide (NO) gas supply pipe 232d. The fluorine-containing gas supply pipe 232c is connected with a fluorine ($F_2$) gas source 273 serving as a fluorine-containing gas source via a mass flow controller (MFC) 241c serving as a gas flow rate controller. Valves 262c and 261c are respectively installed in the upstream and downstream sides of the fluorine-containing gas supply pipe 232c from the MFC 241c. The NO gas supply pipe 232d is connected with a NO gas source 274 serving as a nitrogen oxide-based gas source via a mass flow controller (MFC) 241d serving as a gas flow rate controller. Valves 262d and 261d are respectively installed in the upstream and downstream sides of the NO gas supply pipe 232d from the MFC 241d. When the valves 262c and 261c of the fluorine-containing gas supply pipe 232c and the valves 262d and 261d of the NO gas supply pipe 232d are opened, a $F_2$ gas with its flow rate controlled by the MFC 241c and a NO gas with its flow rate controlled by the MFC 241c are supplied into and mixed in the mixture gas supply pipe 232m. Then, a nitrosyl fluoride (FNO) gas is produced by reaction of the $F_2$ gas and the NO gas in the mixture gas supply pipe 232m. In this manner, the mixture gas supply pipe 232m acts as a "mixture part" in which the $F_2$ gas supplied from the fluorine-containing gas supply pipe 232c and the NO gas supplied from the NO gas supply pipe 232d are mixed and react with each other. That is, the mixture part according to this embodiment is constituted by a pipe arrangement (the mixture gas supply pipe 232m). At this time, when a flow rate of the $F_2$ gas supplied into the mixture gas supply pipe 232m is set such that some of the $F_2$ gas supplied into the mixture gas supply pipe 232m is left without being consumed by the reaction and a flow rate of the NO gas supplied into the mixture gas supply pipe 232m is set such that most of the NO gas supplied into the mixture gas supply pipe 232m is consumed by the reaction, a mixture of the F2 gas (i.e., the $F_2$ gas left without being consumed by the reaction) and the nitrosyl fluoride (FNO) gas, i.e., a gas containing little or no NO gas, is produced in the mixture gas supply pipe 232m. Thermal energy is generated when the $F_2$ gas reacts with the NO gas. Accordingly, the substrate processing apparatus according to this embodiment includes a cooling mechanism 260 serving as an energy removal mechanism to remove exothermic energy generated by the reaction of the $F_2$ gas and the NO gas. For example, as shown in FIG. 3A, the cooling mechanism 260 is installed around the mixture gas supply pipe 232m including a junction point of the fluorine-containing gas supply pipe 232c and the NO gas supply pipe 232d (a mixture point P of the $F_2$ gas and the NO gas). The cooling mechanism 260 is configured to remove the exothermic energy generated by the reaction of the $F_2$ gas and the NO gas by cooling the mixture gas supply pipe 232m serving as the mixture part. Specifically, the cooling mechanism 260 is constituted by a chiller mechanism to circulate a cooling medium such as chiller water, industrial water or the like around the mixture point P, a heat dissipation mechanism including a heat sink and an air cooling fan arranged around the mixture point P, or the like.

With the above configuration, it is possible to generate a mixture of the $F_2$ gas and the FNO gas as a cleaning gas by beforehand mixing (premixing) and reacting the $F_2$ gas and the NO gas in the mixture gas supply pipe 232m and supply the mixture of the $F_2$ gas and the FNO gas from the mixture gas supply pipe 232m into the process container (the process chamber 201) after removing the exothermic energy generated by the reaction by means of the cooling mechanism 260. That is, it is possible to generate the mixture of the $F_2$ gas and the FNO gas on-site and supply it into the process container.

A fluorine-containing gas supply system is mainly constituted by the fluorine-containing gas supply pipe 232c, the MFC 241c and the valves 262c and 261c. It may also be considered that the $F_2$ gas source 273 is included in the fluorine-containing gas supply system. A NO gas supply system is mainly constituted by the NO gas supply pipe 232d, the MFC 241d and the valves 262d and 261d. It may also be considered that the NO gas source 2 is included in the NO gas supply system. A cleaning gas supply system (a system for supplying a mixture of the $F_2$ gas and FNO) is mainly constituted by the fluorine-containing supply system, the NO gas supply system and the mixture gas supply pipe 232m. It may also be considered that the nozzle 230a at the downstream side of the junction point of the process gas supply pipe 232a with the mixture gas supply pipe 232m is included in the cleaning gas supply system.

Inert gas supply pipes 232e, 232f, 232g and 232h are respectively connected to the downstream side of the process gas supply pipe 232a from the valve 261a and the upstream side of the junction point of the process gas supply pipe 232a with the mixture gas supply pipe 232m, the downstream side of the process gas supply pipe 232b from the valve 261b, the downstream side of the fluorine-containing gas supply pipe 232c from the valve 261c, and the downstream side of the NO gas supply pipe 232d from the valve 261d. The inert gas supply pipe 232e is connected with a $N_2$ gas source 275 serving as an inert gas source to supply an inert gas (for example, a nitrogen ($N_2$) gas) via a mass flow controller (MFC) 241e serving as a gas flow rate controller. Valves 262e and 261e are respectively installed in the upstream and downstream sides of the inert gas supply pipe 232e from the MFC 241e. The inert gas supply pipes 232f, 232g and 232h are respectively connected with the $N_2$ gas source 275 via mass flow controllers (MFCs) 241f, 241g and 241h serving as gas flow rate controllers. To be exact, the upstream sides of the inert gas supply pipes 232f, 232g and 232h are connected to the upstream side of the inert gas supply pipe 232e from the valve 262e. That is, the inert gas supply pipes 232f, 232g and 232h are installed to branch from the inert gas supply pipe 232e at the upstream side of the value 262e. Valves 262f, 261f, 262g, 261g, 262h and 261h are respectively installed in the upstream and downstream sides of the inert gas supply pipes 232f, 232g and 232h from the MFCs 241f, 241g and 241h.

An inert gas supply system is mainly constituted by the inert gas supply pipes 232e, 232f, 232g and 232h, the MFCs 241e, 241f, 241g and 241h and the valves 262e, 261e, 262f, 261f, 262g, 261g, 262h and 261h. It may also be considered that the $N_2$ gas source 275 is included in the inert gas supply system. The inert gas supply system also plays a role of diluting the process gas, the fluorine-containing gas, the NO gas and the cleaning gas (the mixture gas). Accordingly, it may be considered that the inert gas supply system acts as a diluted gas supply system and is included in the process gas supply system, the fluorine-containing gas supply system, the NO gas supply system and the cleaning gas supply system. The inert gas supply system also acts as a purge gas supply system.

Gas supply pipes such as the process gas supply pipes 232a, 232b, 232c and 232d, the inert gas supply pipes 232e, 232f, 232g and 232h and the mixture gas supply pipe 232m are made of a metal material such as, for example, stainless steel or the like.

The MFCs 241a, 241b, 241c, 241d, 241e, 241f, 241g and 241h and the valves 261a, 261b, 261c, 261d, 261e, 261f, 261g, 261h, 262a, 262b, 262c, 262d, 262e, 262f, 262g and 262h are connected with a controller 280 to be described later. The controller 280 is configured to control the MFCs 241a, 241b, 241c, 241d, 241e, 241f, 241g and 241h and the valves 261a, 261b, 261c, 261d, 261e, 261f, 261g, 261h, 262a, 262b, 262c, 262d, 262e, 262f, 262g and 262h at intended timings such that the kind of gas supplied into the process chamber 201 in each step to be described later corresponds to a desired gas species, a flow rate of supplied gas corresponds to a desired flow rate and further a concentration of supplied gas corresponds to a desired concentration.

An exhaust pipe 231 to exhaust the internal atmosphere of the process chamber 201 is installed in the manifold 209. The exhaust pipe 231 is disposed at the bottom of a cylindrical space 250 defined by a gap between the inner tube 204 and the outer tube 205 and communicates with the cylindrical space 250. The exhaust pipe 231 is connected with a pressure sensor 245 serving as a pressure detector, and a vacuum pump 246 serving as a vacuum exhauster via a variable conductance valve (for example, an APC (Auto Pressure Controller) valve 242) serving as a pressure regulator (pressure regulating unit). The vacuum pump 246 is configured to perform vacuum exhaust such that the internal pressure of the process chamber 201 reaches a predetermined pressure (degree of vacuum). The vacuum pump 246, the APC valve 242 and the pressure sensor are connected with the controller 280 to be described later. The controller 280 is configured to control the APC valve 242 at a desired timing based on the pressure information detected by the pressure sensor 245 such that the internal pressure of the process chamber 201 reaches a desired pressure. An exhaust system is mainly constituted by the exhaust pipe 231, the pressure sensor 245 and the APC valve 242. It may also be considered that the vacuum pump 246 is included in the exhaust system.

A seal cap 219 serving as a first furnace opening cover for air-tightly blocking the bottom opening of the manifold 209 is disposed below the manifold 209. The seal cap 219 is configured to contact the bottom of the manifold 209 from below in the vertical direction. The seal cap 219 is made of, for example, metal such as stainless steel or the like and has a disc shape. An O-ring 220b serving as a seal member contacting the bottom of the manifold 209 is disposed in the top side of the seal cap 219. A rotation mechanism 254 to rotate the boat 217 to be described later is disposed in the opposite side of the process chamber 201. A shaft 255 of the rotation mechanism 254 is connected to the boat 217 through the seal cap 219. The rotation mechanism 254 is configured to rotate the wafers 200 by rotating the boat 217. The seal cap 219 is configured to be vertically elevated by a boat elevator 115 serving as an elevation mechanism vertically disposed outside the process tube 203. The boat elevator 115 is configured to carry the boat 217 in and out of the process chamber 201 by elevating the seal cap 219. That is, the boat elevator 115 is configured as a transfer device (transfer mechanism) to transfer the boat 217, i.e., the wafers 200, in and out of the process chamber 201. The rotation mechanism 254 and the boat elevator 115 are connected with the controller 280 to be described later. The controller 280 is configured to control the rotation mechanism 254 and the boat elevator 115 at a desired timing such that the rotation mechanism 254 and the boat elevator 115 perform a desired operation. In addition, a shutter 219a serving as a second furnace opening cover for air-tightly blocking the bottom opening of the manifold 209 is disposed below the manifold 209. The shutter 219a is elevated and rotated to contact the bottom of the manifold 209 after the boat 217 is carried out of the process chamber 201 and air-tightly block the process chamber 201 after the boat 217 is carried out of the process chamber 201. An O-ring 220c serving as a seal member contacting the bottom of the manifold 209 is disposed in the top side of the shutter 219a.

The boat 217 serving as a substrate support is made of a heat resistant material such as, for example, quartz, silicon carbide or the like and is configured to support the wafers 200 horizontally stacked in multiple stages with the centers of the wafers 200 concentrically aligned. In addition, a plurality of heat insulating plates 216 serving as heat insulating members, each being made of a heat resistant material such as, for example, quartz, silicon carbide or the like and having a disc shape, is horizontally disposed in multiple stages below the boat 217 and is configured to make it difficult for heat from the heater 206 to be transferred to the manifold 209 side.

A temperature sensor 263 serving as a temperature detector is disposed within the process tube 203. The heater 206 and the temperature sensor 263 are connected with the controller 280 to be described later. The controller 280 is configured to control a state of electric conduction to the heater 206 at a desired timing based on the temperature information detected by the temperature sensor 263 such that the interior of the process chamber 201 has a desired temperature distribution.

Figure 2:
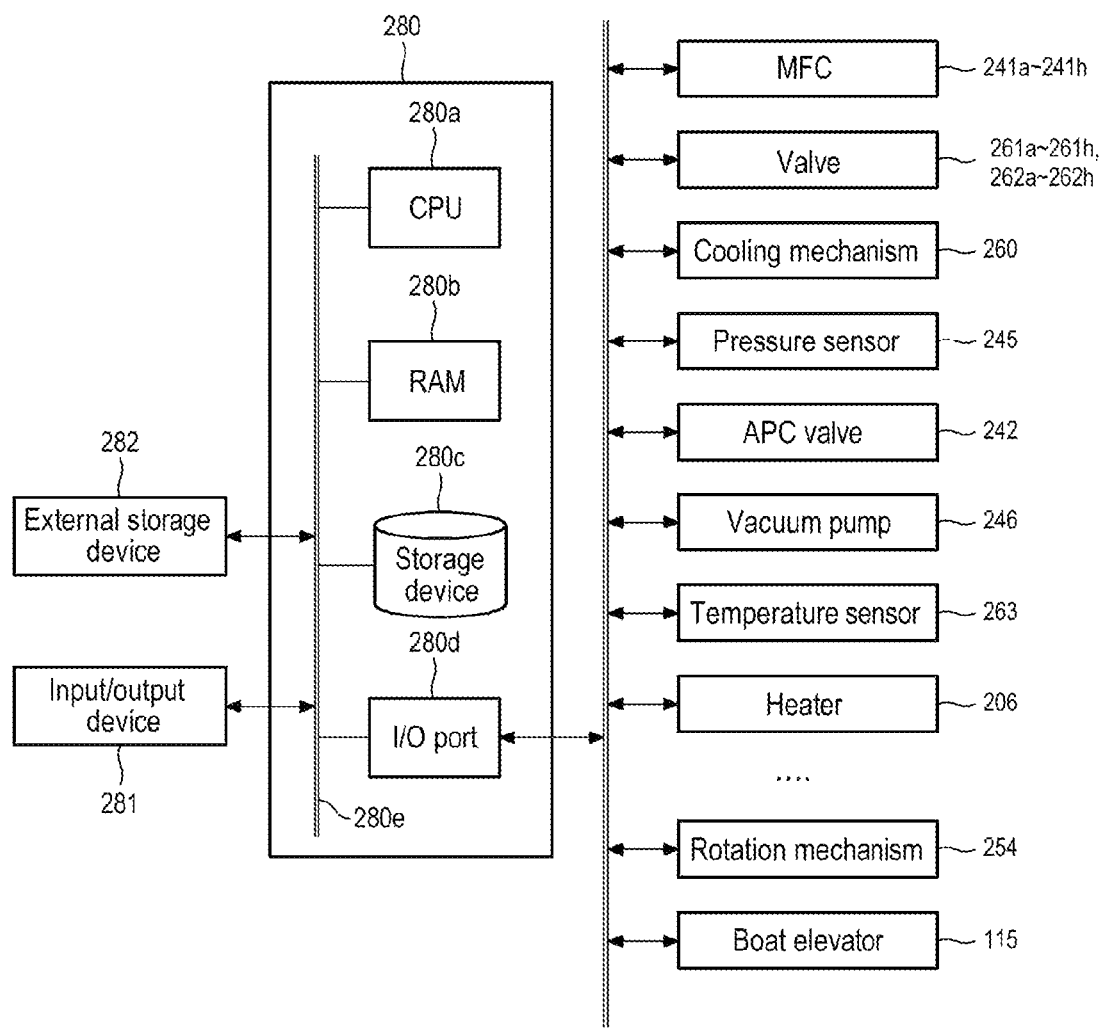
FIG. 2 is a schematic view illustrating a controller of the substrate processing apparatus, in which a control system of the controller is shown by a block diagram.

As shown in FIG. 2, the controller 280 serving as a control part (control means) is constituted by a computer including a CPU (Central Processing Unit) 280a, a RAM (Random Access Memory) 280b, a storage device 280c and an I/O port 280d. The RAM 280b, the storage device 280c and the I/O port 280d are configured to exchange data with the CPU 280a via an internal bus 280e. An input/output device 281 constituted by, for example, a touch panel or the like, is connected to the controller 280.

The storage device 280c is constituted by, for example, a flash memory, a HDD (Hard Disk Drive) or the like. Control programs to control an operation of the substrate processing apparatus, process recipes describing procedures and conditions of substrate processing such as thin film forming, which will be described later, and cleaning recipes describing procedures and conditions of cleaning processing, which will be described later, are readably stored in the storage device 280c. The process recipes function as programs to cause the controller 280 to execute procedures in substrate processing to be described later, to obtain a desired result. The cleaning recipes function as programs to cause the controller 280 to execute procedures in cleaning processing to be described later, to obtain a desired result. Hereinafter, these process recipes, cleaning recipes and control programs are collectively simply referred to as programs. As used herein, the term "programs" may be intended to include process recipes alone, cleaning recipes alone, control programs alone, or any combinations thereof. The RAM 280b is configured as a memory area (work area) in which programs and data read by the CPU 280a are temporarily stored.

The I/O port 280d is connected to the above-mentioned MFCs 241a, 241b, 241c, 241d, 241e, 241f, 241g and 241h, valves 261a, 261b, 261c, 261d, 261e, 261f, 261g, 261h, 262a, 262b, 262c, 262d, 262e, 262f, 262g and 262h, cooling mechanism 260, pressure sensor 245, APC valve 242, vacuum pump 246, temperature sensor 263, heater 206, rotation mechanism 254, boat elevator 115 and so on.

The CPU 280a is configured to read and execute the control programs from the storage device 280c and read the process recipe and the cleaning recipe from the storage device 280c according to an operation command input from the input/output device 281. The CPU 280a is further configured to control a flow rate adjustment operation of various gases by the MFCs 241a, 241b, 241c, 241d, 241e, 241f, 241g and 241h, an opening/closing operation of the valves 261a, 261b, 261c, 261d, 261e, 261f, 261g, 261h, 262a, 262b, 262c, 262d, 262e, 262f, 262g and 262h, a temperature adjustment operation of the mixture point P by the cooling mechanism 260, an opening/closing operation of the APC valve 242, a pressure adjustment operation by the APC valve 242 based on the pressure sensor 245, start and stop of the vacuum pump 246, a temperature adjustment operation of the heater 206 based on the temperature sensor 263, rotation and a rotation speed adjustment operation of the boat 217 by the rotation mechanism 254, an elevation operation of the boat 217 by the boat elevator 115, etc., according to contents of the read process recipe and cleaning recipe.

The controller 280 may be configured as a general-purpose computer without being limited to a dedicated computer. For example, in the embodiment, the controller 280 may be configured by preparing an external storage device (for example, a magnetic tape, a magnetic disk such as a flexible disk or a hard disk, an optical disk such as CD or DVD, a magneto-optical disk such as MO, and a semiconductor memory such as a USB memory or a memory card) 282 which stores the above-described programs and installing the programs from the external storage device 282 into the general-purpose computer. A means for providing the programs for the computer is not limited to the case where the programs are provided through the external storage device 282. For example, the programs may be provided using a communication means such as the Internet, a dedicated line or the like, without the external storage device 282. The storage device 280c and the external storage device 282 are implemented with a computer readable recording medium and will be hereinafter collectively simply referred to as a recording medium. In the specification, the term "recording medium" may include the storage device 280c alone, the external storage device 282 alone, or both thereof.

(2) Thin Film Forming Process

Figure 4:
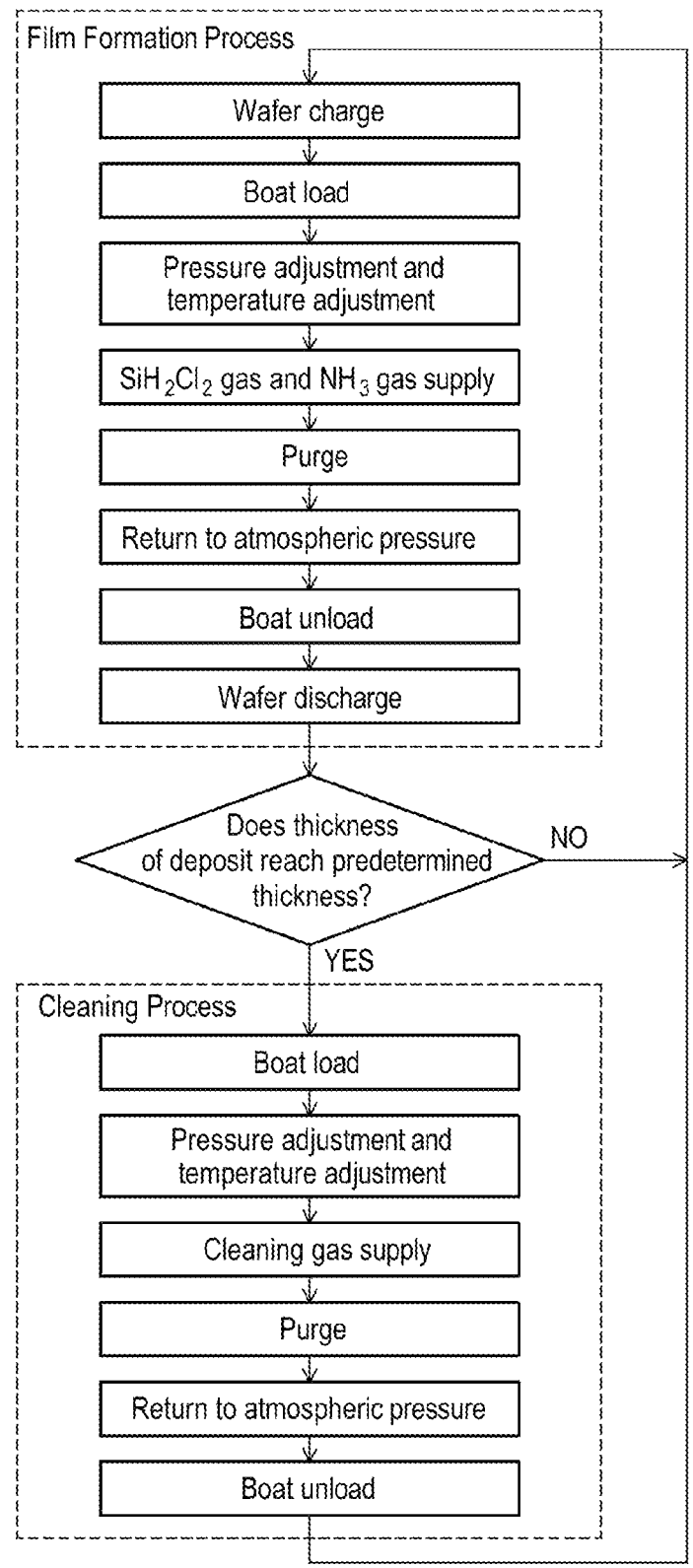
FIG. 4 is a view illustrating a flow of film formation and cleaning according to some embodiments.

As one of processes of manufacturing a semiconductor device using the treatment furnace 202 configured as above, a process of forming a thin film on each wafer 200 in the process chamber 201 by a CVD method and a process of cleaning the interior of the process chamber 201 will be now described with reference to FIG. 4. FIG. 4 shows a flow of film formation and cleaning processes according to this embodiment. In the following description, operations of various components constituting the substrate processing apparatus are controlled by the controller 280.

(Wafer Charge and Boat Load)

When a plurality of wafers 200 is loaded on the boat 217 (wafer charge), the boat 217 supporting the plurality of wafers 200 is lifted up and loaded into the process chamber 201 by the boat elevator 115 (boat load), as shown in FIG. 1. In this state, the seal cap 219 seals the bottom of the manifold 209 via the O-ring 220b.

(Pressure Adjustment and Temperature Adjustment)

The interior of the process chamber 201 is vacuum-exhausted by the vacuum pump 246 to set the interior to a desired pressure (degree of vacuum). At this time, the internal pressure of the process chamber 201 is measured by the pressure sensor 245 and the APC valve 242 is feedback-controlled based on the measured pressure information (pressure adjustment). The vacuum pump 246 remains activated at least until the wafers 200 are completely processed. The interior of the process chamber 201 is heated by the heater 206 to set the interior to a desired temperature. At this time, a state of electric conduction to the heater 206 is feedback-controlled based on the temperature information detected by the temperature sensor 263 such that the interior of the process chamber 201 has a desired temperature distribution (temperature adjustment). The heating of the interior of the process chamber 201 by the heater 206 continues at least until the wafers 200 are completely processed. Subsequently, the boat 217 and the wafers 200 begin to be rotated by the rotation mechanism 254. The rotation of the boat 217 and the wafers 200 by the rotation mechanism 254 continues at least until the wafers 200 are completely processed.

(Supply of $SiH_2Cl_2$ Gas and $NH_3$ Gas)

Subsequently, with the internal temperature and pressure of the process chamber 201 set to the desired temperature and pressure, a $SiH_2Cl_2$ gas serving as the first process gas and a $NH_3$ gas serving as the second process gas are supplied into the process chamber 201 from the $SiH_2Cl_2$ gas source 271 serving as the first process gas source and the $NH_3$ gas source 272 serving as the second process gas source, respectively. As the valves 262a, 261a, 262b and 261b are opened, the $SiH_2Cl_2$ gas and the $NH_3$ gas supplied into the process chamber 201 from the $SiH_2Cl_2$ gas source 271 and the $NH_3$ gas source 272 are controlled to be set to their respect desired flow rates by their respective MFCs 241a and 241b and are then introduced into the process chamber 201 from the nozzles 230a and 230b via the process gas supply pipes 232a and 232b.

At the same time, a $N_2$ gas may be supplied into the process chamber 201 from the $N_2$ gas source 275 serving as the inert gas source to dilute the process gases (the $SiH_2Cl_2$ gas and the $NH_3$ gas). In this case, for example, when the valves 262e, 261e, 262f and 261f are opened, the $N_2$ gases supplied into the inert gas supply pipes 232e and 232f from the $N_2$ gas source 275 are controlled to be set to their respective flow rates by the respective MFCs 241e and 241f and are then introduced into the process chamber 201 from the nozzles 230a and 230b via the process gas supply pipes 232a and 232b. The $N_2$ gas is mixed with the $SiH_2Cl_2$ gas and the $NH_3$ gas in the process gas supply pipes 232a and 232b. The concentration of the process gases can also be controlled by controlling a flow rate of the $N_2$ gas.

The process gases introduced into the process chamber 201 rise within the process chamber 201, are flown into the cylindrical space 250 from the upper end opening of the inner tube 204, are flown down within the cylindrical space 250, and are exhausted from the exhaust pipe 231. The process gases contact the surfaces of the wafers 200 when these gases pass through the process chamber 201. At this time, a film (i.e., a silicon nitride (SiN) film) is deposited on the surface of each wafer 200 by thermal CVD reaction.

(Purge and Return to Atmospheric Pressure)

When a preset processing time elapses, the supply of the process gases is stopped. That is, as the valves 262a, 261a, 262b and 261b are closed, the supply of the $SiH_2Cl_2$ gas and the $NH_3$ gas into the process chamber 201 from the $SiH_2Cl_2$ gas source 271 and the $NH_3$ gas source 272 is stopped. Thereafter, with the valves 262e, 261e, 262f and 261f opened, as the $N_2$ gas is supplied into the process chamber 201 from the $N_2$ gas source 275 and is exhausted from the exhaust pipe 231, the process chamber 201 is purged. Thus, the internal atmosphere of the process chamber 201 is substituted with the $N_2$ gas, thereby returning the internal pressure of the process chamber 201 to the atmospheric pressure.

(Boat Unload and Wafer Discharge)

Thereafter, the seal cap 219 is descended by the boat elevator 115 to open the bottom of the manifold 209 while carrying the processed wafer 200 from the bottom of the manifold 209 out of the process tube 203 with the wafer 200 supported by the boat 217 (boat unload). Thereafter, the processed wafer 200 is discharged out of the boat 217 (wafer discharge).

For example, for formation of a silicon nitride film, process conditions when the wafer 200 is processed in the treatment furnace 202 according to this embodiment may be as follows:

Wafer temperature: 650 to 800 degrees C.
Internal pressure of process chamber: 10 to 500 Pa
Flow rate of supplied $SiH_2Cl_2$ gas: 100 to 500 sccm
Flow rate of supplied $NH_3$ gas: 500 to 5000 sccm The wafer 200 is processed with the process conditions set to any values falling within the respective ranges.

(3) Cleaning Process

When the above-described film forming process is repeated, a film such as a silicon nitride film or the like is accumulatively adhered on surfaces of members in the process container, such as an inner wall of the process tube 203. That is, a deposit including the film is adhered to the interior of the process container. A cleaning process for the interior of the process container is performed when the thickness of the deposit adhered to the interior of the process container (the thickness of the accumulatively adhered film) reaches a predetermined thickness to prevent the deposit from being peeled off and dropped. That is, the cleaning process according to this embodiment is performed by providing a process container in which a process of forming a film on the wafer 200 is performed, and removing a deposit including the film adhered to the interior of the process container by supplying a cleaning gas into the process container after performing the process.

In removing the deposit including the film, a mixture gas of a fluorine-containing gas and a nitrosyl fluoride (FNO) gas is generated as the cleaning gas by mixing and reacting the fluorine-containing gas and the nitrogen monoxide (NO) gas in the mixture gas supply pipe 232*m* serving as the mixture part and the mixture gas is supplied from the mixture gas supply pipe 232*m* into the process container (the process chamber 201) after removing exothermic energy generated by the reaction. A method of cleaning the interior of the process chamber 201 using a fluorine ($F_2$) gas as the fluorine-containing gas and a nitrogen ($N_2$) gas as the inert gas will now be described in detail.

(Boat Load)

The empty boat 217 with no wafer 200 loaded thereon is lifted up and loaded into the process chamber 201 by the boat elevator 115 (boat load). In this state, the seal cap 219 seals the bottom of the manifold 209 via the O-ring 220*b*.

(Pressure Adjustment and Temperature Adjustment)

The interior of the process chamber 201 is vacuum-exhausted by the vacuum pump 246 to set the interior to a desired pressure (degree of vacuum). At this time, the internal pressure of the process chamber 201 is measured by the pressure sensor 245 and the APC valve 242 is feedback-controlled based on the measured pressure information (pressure adjustment). The vacuum pump 246 remains activated at least until the cleaning process in the process chamber 201 is completed. The interior of the process chamber 201 is heated by the heater 206 to set the interior to a desired temperature. At this time, a state of electric conduction to the heater 206 is feedback-controlled based on the temperature information detected by the temperature sensor 263 such that the interior of the process chamber 201 has a desired temperature distribution (temperature adjustment). The heating of the interior of the process chamber 201 by the heater 206 continues at least until the cleaning process in the process chamber 201 is completed. Subsequently, the boat 217 begins to be rotated by the rotation mechanism 254. The rotation of the boat 217 by the rotation mechanism 254 continues at least until the cleaning process in the process chamber 201 is completed. However, at this time, the boat 217 may not be rotated.

(Supply of Cleaning Gas)

Subsequently, with the internal temperature and pressure of the process chamber 201 set to a predetermined temperature and pressure, respectively, as the valves 262*c* and 261*c* of the fluorine-containing gas supply pipe 232*c* and the valves 262*d* and 261*d* of the NO gas supply pipe 232*d* are opened, a $F_2$ gas with its flow rate controlled by the MFC 241*c* and a NO gas with its flow rate controlled by the MFC 241*d* are supplied into the mixture gas supply pipe 232*m* serving as the mixture part.

The $F_2$ gas and the NO gas are mixed in the mixture gas supply pipe 232*m*, at which time nitrosyl fluoride (FNO) is produced by the reaction of $F_2$ and NO. At this time, a flow rate of the $F_2$ gas supplied into the mixture gas supply pipe 232*m* is set such that some of the $F_2$ gas supplied into the mixture gas supply pipe 232*m* is left without being consumed by the reaction and a flow rate of NO gas supplied into the mixture gas supply pipe 232*m* is set such that most of the NO gas supplied into the mixture gas supply pipe 232*m* is consumed by the reaction. As a result, a mixture gas of the F2 gas (the $F_2$ gas left without being consumed by the reaction) and the FNO gas, i.e., a gas containing little or no NO gas, is produced as the cleaning gas in the mixture gas supply pipe 232*m*. The produced cleaning gas (mixture gas) is supplied from the mixture gas supply pipe 232*m* into the process chamber 201 via the process gas supply pipe 232*a* and the nozzle 230*a*.

The cleaning gas (mixture gas) supplied into the process chamber 201 rises within the process chamber 201, flows into the cylindrical space 250 from the upper end opening of the inner tube 204, flows down within the cylindrical space 250, and is exhausted from the exhaust pipe 231. The cleaning gas contacts a deposit including a silicon nitride film or the like accumulatively adhered on the inner wall of the process tube 203 and the surface of the boat 217 when the cleaning gas passes through the process chamber 201. That is, the deposit is removed by an etching reaction of the deposit and the mixture gas of the $F_2$ gas and the FNO gas. In addition, since the FNO gas acts to promote the etching reaction by the $F_2$ gas, an etching rate can be increased to enhance the cleaning performance. In addition, this allows the process conditions such as the internal temperature and pressure of the process chamber 201 to be set to relatively low temperature and relatively low pressure conditions.

As described above, thermal energy is generated by the reaction of the $F_2$ gas and the NO gas. For example, when the $F_2$ gas and the NO gas are mixed and react with each other, a mixture gas after the reaction (i.e., a cleaning gas) may exceed one hundred and tens degrees C., even 200 degrees C. in terms of temperature. In this case, the mixture gas supply pipe 232*m* made of a metal material such as, for example, stainless steel or the like may overheat, which is likely to corrode or deform the mixture gas supply pipe 232*m*. In addition, if such a hot cleaning gas is supplied into the process chamber 201, a quartz member and so on within the process chamber 201 may likely be damaged. Accordingly, when the cleaning gas is generated in the mixture gas supply pipe 232*m*, the cooling mechanism 260 is used to cool the mixture gas supply pipe 232*m* so as to remove exothermic energy generated by the reaction of the $F_2$ gas and the NO gas. This can prevent the mixture gas supply pipe 232*m* from overheating, thereby preventing the mixture gas supply pipe 232*m* from corroding or deforming.

In addition, when the cleaning gas is supplied into the process chamber 201, in order to prevent the cleaning gas from being introduced into the nozzle 230*b*, the valves 262*f* and 262*f* are opened to flow a $N_2$ gas serving as an inert gas into the inert gas supply pipe 232*f*. The $N_2$ gas is supplied into the process chamber 201 via the inert gas supply pipe 232*f*, the process gas supply pipe 232*b* and the nozzle 230*b*. At this time, in order to dilute the cleaning gas supplied into the process chamber 201, the valves 262*e* and 261*e* may be opened to flow the $N_2$ gas into the inert gas supply pipe 232*e*. The $N_2$ gas is supplied into the process chamber 201 via the inert gas supply pipe 232*e*, the process gas supply pipe 232*a* and the nozzle 230*a*. At this time, the concentration of the cleaning gas can also be controlled by controlling a flow rate of the $N_2$ gas by the MFC 241*e*. Examples of the inert gas used may include rare gases such as an argon (Ar) gas, a helium (He) gas and the like, in addition to the $N_2$ gas.

In the above-described cleaning process, in order to shorten the time required to remove a deposit adhered in the process chamber 201 while reducing damage suffered by the quartz member in the process chamber 201, it is desirable to adjust a ratio of "$F_2$ gas flow rate B" to "FNO gas flow rate A", i.e., a ratio (B/A) of "flow rate B of the $F_2$ gas remaining without being consumed by the reaction" to "flow rate A of the FNO gas generated by the reaction", to fall within a predetermined range. Specifically, the ratio (B/A) may be equal to or more than 0.5 and equal to or less than 2, more specifically, equal to or more than 0.5 and less than 1, or further more specifically, equal to or more than 0.5 and equal to or less than 0.75.

If the ratio (B/A) is less than 0.5, an etching rate of the deposit adhered in the process chamber 201 is likely to be lowered and an etching selectivity of the deposit adhered in the process chamber 201 and the quartz member in the process chamber 201 (i.e., etching rate of the deposit/etching rate of the quartz member) is likely to deteriorate. That is, the time required to remove the deposit adhered in the process chamber 201 is likely to be lengthened and damage suffered by the quartz member in the process chamber 201 is likely to be increased. In contrast, if the ratio (B/A) is equal to or more than 0.5, the etching rate of the deposit adhered in the process chamber 201 can be rapidly raised and the etching selectivity can be drastically improved. That is, it is possible to shorten the time required to remove the deposit adhered in the process chamber 201 while reducing damage suffered by the quartz member in the process chamber 201.

However, if the ratio (B/A) is equal to or more than 1, the etching selectivity is likely to deteriorate although the etching rate of the deposit adhered in the process chamber 201 may rise. That is, although the time required to remove the deposit adhered in the process chamber 201 may be shortened, an etching damage suffered by the quartz member in the process chamber 201 is likely to be increased. In contrast, if the ratio (B/A) is less than 1, the etching rate of the deposit adhered in the process chamber 201 can be raised and the etching selectivity can be improved. That is, it is possible to shorten the time required to remove the deposit adhered in the process chamber 201 while reducing an etching damage suffered by the quartz member in the process chamber 201. If the ratio (B/A) is equal to or less than 0.75, the etching selectivity can be further improved and etching damage suffered by the quartz member in the process chamber 201 is likely to be further reduced. If the ratio (B/A) exceeds 2, the etching selectivity is less than a practical use level. When the ratio (B/A) is equal to or less than 2, the etching selectivity can amount to a practical use level.

In addition, the ratio (B/A) can be controlled by controlling a ratio of flow rates of the $F_2$ gas and the NO gas supplied into the mixture gas supply pipe 232m and the internal pressure and temperature of the mixture gas supply pipe 232m.

For example, assuming that the mixture gas supply pipe 232m is under temperature and pressure conditions where the $F_2$ gas and the NO gas react with each other with 100% yield (i.e., conditions where a relationship of $2NO+F_2 \rightarrow 2FNO$ is established) and a ratio of flow rates of gases supplied into the mixture gas supply pipe 232m (i.e., NO gas flow rate:$F_2$ gas flow rate) is set to 2:1, the $F_2$ gas supplied into the mixture gas supply pipe 232m is all consumed by the reaction and accordingly the ratio (B/A) is 0. In contrast, under the conditions of the reaction with 100% yield, when a proportion of the $F_2$ gas in the above stoichiometric ratio (NO gas flow rate:$F_2$ gas flow rate=2:1) is increased, some of the $F_2$ gas supplied into the mixture gas supply pipe 232m may be left unreacted, thereby increasing the ratio (B/A).

Specifically, under the conditions of the reaction with 100% yield, when NO gas flow rate:$F_2$ gas flow rate=2:$\alpha$, a relationship of $2NO+\alpha F_2 \rightarrow 2FNO+(\alpha-1)F_2$ is established and accordingly the ratio (B/A) is $(\alpha-1)/2$. Accordingly, under the conditions of the reaction with 100% yield, the ratio (B/A) is 0.5 when NO gas flow rate:$F_2$ gas flow rate=2:2, the ratio (B/A) is 0.75 when NO gas flow rate:$F_2$ gas flow rate=2:2.5, and the ratio (B/A) is 1 when NO gas flow rate:$F_2$ gas flow rate=2:3.

In this manner, it is possible to control the ratio (B/A) by obtaining the relationship of mixture conditions of the $F_2$ gas and the NO gas in advance and controlling the mixture conditions of the $F_2$ gas and the NO gas.

For example, etching conditions for the deposit in the cleaning process may be as follows:

Internal temperature of process chamber: 200 to 600 degrees C.

Internal pressure of process chamber: 133 Pa (1 Torr) to 66500 Pa (500 Torr)

Flow rate of supplied $F_2$ gas: 200 sccm (0.2 slm) to 4000 sccm (4 slm)

Flow rate of supplied NO gas: 200 sccm (0.2 slm) to 4000 sccm (4 slm)

Flow rate of supplied $N_2$ gas: 500 sccm (0.5 slm) to 20000 sccm (20 slm)

The deposit is etched with the etching conditions set to any values falling within the respective ranges.

(Purge and Return to Atmospheric Pressure)

With the lapse of a preset etching time, when the etching of the deposit adhered in the process chamber 201 is ended, the valves 262c, 261c, 262d and 261d are closed to stop the supply of the cleaning gas (mixture gas) into the process chamber 201. Thereafter, with the valves 262e, 261e, 262f, 261f, 262g, 261g, 262h and 261h opened, as the $N_2$ gas is supplied into the process chamber 201 from the $N_2$ gas source 275 and is exhausted from the exhaust pipe 231, the process chamber 201 is purged (purge). Thus, the internal atmosphere of the process chamber 201 is substituted with the $N_2$ gas, thereby returning the internal pressure of the process chamber 201 to atmospheric pressure (return to atmospheric pressure), and then the cleaning process according to this embodiment is ended.

(Boat Unload)

When the cleaning process is ended, the seal cap 219 is lowered by the boat elevator 115 to open the bottom of the manifold 209 while carrying the empty boat 217 from the bottom of the manifold 209 out of the process tube 203 (boat unload). Then, the above-described film forming process is resumed.

(4) Certain Advantages

This embodiment may in some instances provide one or more advantages as follows.

(a) According to this embodiment, the mixture gas of the $F_2$ gas and the FNO gas is supplied, as the cleaning gas, into the process chamber 201. Since the FNO gas acts to promote etching reaction by the $F_2$ gas, an etching rate of a deposit adhered in the process chamber 201 can be increased to enhance the cleaning performance. In addition, this allows the process conditions such as the internal temperature and pressure of the process chamber 201 to be set to relatively low temperature and relatively low pressure conditions. For example, even when the internal temperature of the process chamber 201 is set to 400 degrees C. and the internal pressure of the process chamber 201 is set to 100 Torr, the cleaning can be performed well. As a result, it is possible to prevent the quartz member in the process chamber 201 from being etched.

Instead of the mixture gas of the $F_2$ gas and the FNO gas, use of the $F_2$ gas alone as the cleaning gas requires a relatively high internal temperature of the process chamber 201 in order to obtain a practical etching rate, in which case it is confirmed that the quartz member in the process chamber 201 is likely to be damaged. It is also confirmed that use of the FNO gas alone as the cleaning gas makes it difficult to perform the etching because of a low etching rate of the deposit adhered in the process chamber 201. That is, it is proved that the FNO gas alone makes it difficult to perform the etching although the FNO gas may promote the etching reaction when the $F_2$ gas is added to the FNO gas.

(b) According to this embodiment, when the cleaning gas (mixture gas) is generated in the mixture gas supply pipe 232m, the cooling mechanism 260 is used to cool the mixture gas supply pipe 232m so as to remove exothermic energy generated by the reaction of the $F_2$ gas and the NO gas. This can prevent the mixture gas supply pipe 232m made of a metal material such as, for example, stainless steel or the like, from being overheated, thereby preventing the mixture gas supply pipe 232m from being corroded or deformed. This can also prevent a hot cleaning gas from being introduced into the process chamber 201, thereby preventing the quartz member and so on in the process chamber 201 from being damaged. Thus, it is possible to provide an improved substrate processing quality. That is, it is possible to prevent particles such as corrosion products or the like from being transported into the process chamber 201 along with the gas and prevent particles such as quartz powders and so on from being produced in the process chamber 201. As a result, the amount of particles reaching the wafers 200 can be reduced, which can result in prevention of product defects and improvement of quality of substrate processing. In addition, as described earlier, the exothermic reaction produced by the mixture of the F2 gas and the NO gas, both of which are combustible gases, and a damage which is likely to be suffered by components of the substrate processing apparatus 100 due to the exothermic reaction are problems first revealed by the careful studies of the present inventors.

(c) According to this embodiment, the $F_2$ gas and the NO gas are beforehand mixed (premixed) in the mixture gas supply pipe 232m, instead of being separately supplied into and mixed in the process chamber 201. In addition, the flow rate of the NO gas supplied into the mixture gas supply pipe 232m is set such that the NO gas is mostly or all consumed by the reaction with the $F_2$ gas. That is, no reaction of the mixed $F_2$ gas and NO gas is made in the process chamber 201. This can prevent a local exothermic reaction from being generated in the process chamber 201, thereby avoiding the quartz member in the process chamber 201 from being partially etched.

(d) According to this embodiment, the mixing of the $F_2$ gas and the NO gas is performed in the mixture gas supply pipe 232m having a relatively small volume, instead of the process chamber 201. This allows the $F_2$ gas and the NO gas to be efficiently mixed with each other, thereby increasing efficiency of FNO generation. As a result, the mixture gas of the F2 gas and the FNO gas can be generated on-site and easily supplied into the process chamber 201.

(e) According to this embodiment, the NO gas is used as a nitrogen oxide-based gas to be mixed with the $F_2$ gas. This can provide high efficiency of FNO generation. If a $N_2O$ gas or a $NO_2$ gas instead of the NO gas is used as the nitrogen oxide-based gas, since it is hard for the $N_2O$ gas or the $NO_2$ gas to react with a fluorine-containing gas, there is a need to install a dedicated preliminary decomposition chamber, i.e., a preliminary decomposition chamber for the $N_2O$ gas or the $NO_2$ gas, at the upstream side of the mixture gas supply pipe 232m. In contrast, since the NO gas reacts with the $F_2$ gas sufficiently in the mixture gas supply pipe 232m, there is no need to install a dedicated preliminary decomposition chamber, i.e., a preliminary decomposition chamber for the NO gas.

Other Embodiments

Although the specific embodiment of the present disclosure has been described in detail, the present disclosure is not limited thereto but may be changed in different ways without departing from the spirit and scope of the present disclosure.

Figure 3B:
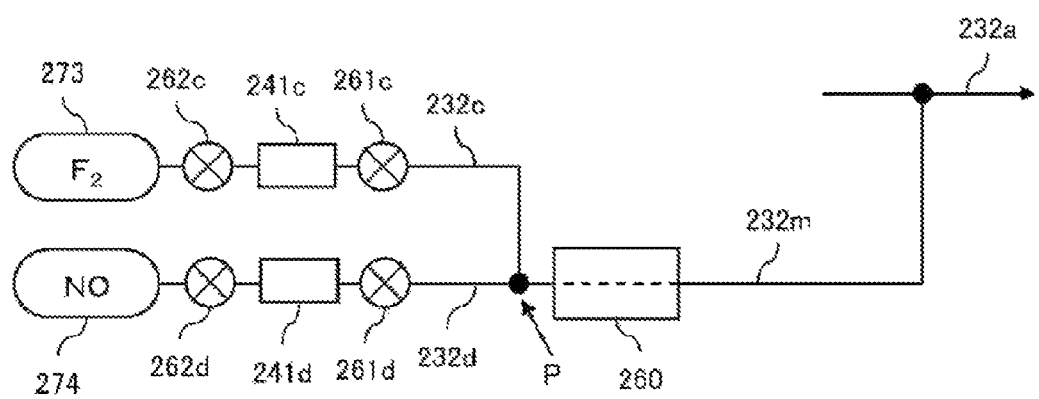
Figure 3C:
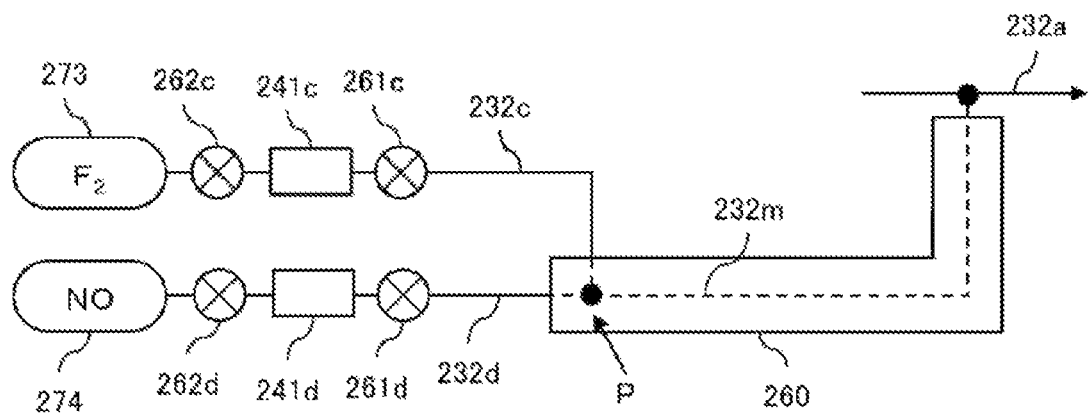

For example, although it has been illustrated in the above embodiment that the cooling mechanism 260 is installed to surround the mixture point P of the $F_2$ gas and the NO gas as shown in FIG. 3A, the present disclosure is not limited thereto. For example, as shown in FIG. 3B, the cooling mechanism 260 may be installed to partially surround a portion of the mixture gas supply pipe 232m in the downstream side of the mixture point P. Alternatively, for example, as shown in FIG. 3C, the cooling mechanism 260 may be installed to entirely surround the mixture point P of the $F_2$ gas and the NO gas and the mixture gas supply pipe 232m in the downstream side of the mixture point P.

In addition, for example, although it has been illustrated in the above embodiment that the cooling mechanism 260 serving as an energy removal mechanism cools the mixture part (the mixture gas supply pipe 232m) itself, the present disclosure is not limited thereto. For example, the cooling mechanism 260 may be configured as a heat exchanger or the like to cool a gas after the reaction in the mixture part (the mixture gas supply pipe 232m), i.e., the cleaning gas.

Figure 3D:
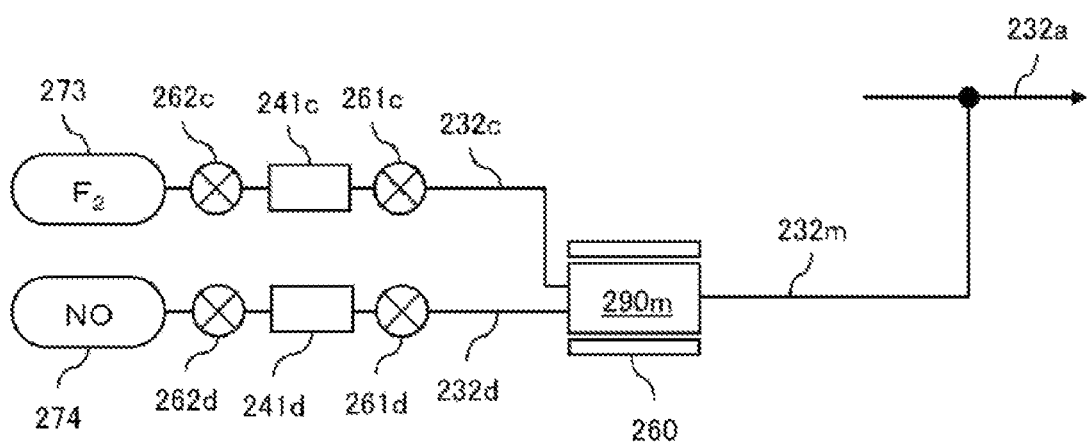

In addition, for example, although it has been illustrated in the above embodiment that the mixture part where the $F_2$ gas and the NO gas are mixed and react with each other is constituted by the mixture gas supply pipe 232m, i.e., a pipe arrangement, the present disclosure is not limited thereto. For example, as shown in FIG. 3D, the mixture part may be constituted by a mixture chamber 290m instead of the pipe arrangement. In this case, the cooling mechanism 260 may be installed around the mixture chamber 290m or around the mixture chamber 290m and the mixture gas supply pipe 232m. FIG. 3D shows one example where the cooling mechanism 260 is installed around the mixture chamber 290m.

In addition, for example, although it has been illustrated in the above embodiment that the supply of the cleaning gas (mixture gas) into the process chamber 201 is performed by the nozzle 230a alone, the present disclosure is not limited thereto. For example, the downstream side of the mixture gas supply pipe 232m may be connected to the process gas supply pipe 232b and the supply of the cleaning gas (mixture gas) may be performed from the nozzle 230b. In this case, in order to prevent the cleaning gas (mixture gas) from being introduced into the nozzle 230a, the valves 262e and 261e are opened to flow the $N_2$ gas serving as an inert gas into the inert gas supply pipe 232e. Alternatively, for example, the supply of the cleaning gas (mixture gas) may be performed from both the nozzle 230a and the nozzle 230b.

In addition, for example, although it has been illustrated in the above embodiment that the fluorine gas ($F_2$ gas) is used as the fluorine-containing gas, the present disclosure is not limited thereto. For example, the fluorine-containing gas used may be at least one selected from a group consisting of a nitrogen fluoride gas such as a nitrogen trifluoride gas ($NF_3$ gas) or the like, a carbon fluoride gas such as a carbon tetrafluoride gas ($CF_4$ gas), ethane hexafluoride gas ($C_2F_6$ gas), propane octafluoride gas ($C_3F_8$ gas) or the like, and a chlorine fluoride gas such as a chlorine trifluoride gas ($ClF_3$ gas), chlorine pentafluoride gas ($ClF_5$ gas) or the like. Even in these cases, when the fluorine-containing gas and the NO gas are mixed and react with each other in the mixture part, a mixture of the fluorine-containing gas and the FNO gas may be generated as the cleaning gas.

However, the nitrogen fluoride gas and the carbon fluoride gas have a relatively low reactivity with the NO gas. Accordingly, in the case of using these gases, a fluorine-containing gas produced after decomposition of the nitrogen fluoride gas or the carbon fluoride gas is mixed with the NO gas in the mixture part. In this case, a preliminary decomposition chamber is installed in the upstream side of the mixture part, a decomposition source such as a plasma source, a heater or the like is used to decompose the nitrogen fluoride gas or the carbon fluoride gas in the preliminary decomposition chamber, and then a fluorine-containing gas produced after the decomposition of the nitrogen fluoride gas or the carbon fluoride gas is mixed with the NO gas in the mixture part. In particular, it is harder for the carbon fluoride gas to thermally decompose and the thermal decomposition temperature is higher than the nitrogen fluoride gas. Accordingly, since the carbon fluoride gas is required to be heated at a relatively high temperature in order to thermally decompose the carbon fluoride gas, it is desirable to decompose the carbon fluoride gas by means of plasma. However, when the carbon fluoride gas is decomposed by means of plasma, $CF_4$ or the like may be produced by recombination. In this case, it is desirable to add a gas inhibiting (suppressing) the recombination (a recombination inhibiting gas), such as an $O_2$ gas or the like, to the carbon fluoride gas when the carbon fluoride gas is decomposed by means of plasma. That is, with the carbon fluoride gas and the recombination inhibiting gas supplied into the preliminary decomposition chamber, it is desirable to decompose the carbon fluoride gas by means of plasma in the preliminary decomposition chamber.

In contrast, the fluorine gas and the chlorine fluoride gas have a relatively high reactivity with the NO gas. Accordingly, it is desirable to use these gases since there is no need to install a preliminary decomposition chamber and a decomposition source such as a plasma source, a heater or the like, used to decompose the fluorine-containing gas.

In the case where a nitrogen fluoride gas such as a $NF_3$ gas or the like or a carbon fluoride gas such as a $CF_4$ gas or the like is used as the fluorine-containing gas, etching conditions for the deposit in the cleaning process may be as follows:

Internal temperature of process chamber: 200 to 600 degrees C.

Internal pressure of process chamber: 133 Pa (1 Torr) to 66500 Pa (500 Torr)

Internal temperature of preliminary decomposition chamber: 500 to 800 degrees C.

Internal pressure of preliminary decomposition chamber: 133 Pa (1 Torr) to atmospheric pressure (760 Torr)

Flow rate of supplied nitrogen fluoride gas or carbon fluoride gas: 200 sccm (0.2 slm) to 4000 sccm (4 slm)

Flow rate of supplied NO gas: 200 sccm (0.2 slm) to 4000 sccm (4 slm)

Flow rate of supplied $N_2$ gas: 500 sccm (0.5 slm) to 20000 sccm (20 slm)

In the case where a chlorine fluoride gas such as a $ClF_3$ gas or the like is used as the fluorine-containing gas, etching conditions for the deposit in the cleaning process may be as follows:

Internal temperature of process chamber: 200 to 500 degrees C.

Internal pressure of process chamber: 133 Pa (1 Torr) to 66500 Pa (500 Torr)

Flow rate of supplied chlorine fluoride gas: 200 sccm (0.2 slm) to 2000 sccm (2 slm)

Flow rate of supplied NO gas: 200 sccm (0.2 slm) to 2000 sccm (2 slm)

Flow rate of supplied $N_2$ gas: 500 sccm (0.5 slm) to 20000 sccm (20 slm)

In addition, for example, although it has been illustrated in the above embodiment that the deposit including the silicon nitride (SiN) film is removed to clean the interior of the process container, the present disclosure is not limited thereto. For example, the present disclosure may be appropriately applied to a case where the interior of the process container is cleaned by removing deposits including silicon-based nitride films such as a silicon carbonitride (SiCN) film, a silicon oxynitride (SiON) film, a silicon oxycarbonitride (SiOCN) film, a silicon borocarbonitride (SiBCN) film, a silicon boronitride (SiBN) film and the like, that is, a case where the interior of the process container in which these silicon-based nitride films are formed is cleaned.

In addition, the present disclosure may be also appropriately applied to a case where the interior of the process container is cleaned by removing deposits including metal nitride films such as a titanium nitride (TiN) film, a tantalum nitride (TaN) film and the like, that is, a case where the interior of the process container in which these metal nitride films are formed is cleaned.

In addition, although it has been illustrated in the above embodiment that the interior of the process container of the batch type substrate processing apparatus to process a plurality of substrates at once is cleaned, the present disclosure is not limited thereto but may be suitably applied to a case where the interior of a process container of a single wafer type substrate processing apparatus to process a single substrate or several substrates at once is cleaned. In addition, although it has been illustrated in the above embodiment that the interior of the process container of the substrate processing apparatus including the hot wall type treatment furnace is cleaned, the present disclosure is not limited thereto but may be suitably applied to a case where the interior of a process container of a substrate processing apparatus including a cold wall type treatment furnace is cleaned.

In addition, the above embodiments, modifications and applications may be used in proper combinations.

In addition, the present disclosure may be implemented by changing process recipes and cleaning recipes of an existing substrate processing apparatus, for example. The change of process recipes and cleaning recipes may include installing the process recipes and the cleaning recipes of the present disclosure in the existing substrate processing apparatus via a telecommunication line or a recording medium storing the process recipes and the cleaning recipes, and operating an input/output device of the existing substrate processing apparatus to change its process recipes and cleaning recipes into the process recipes and the cleaning recipes of one or more of the disclosed embodiments.

EXAMPLES

After repeating a process of forming a SiN film on a wafer in the process container of the substrate processing apparatus according to the above-described embodiment, the interior of the process container was cleaned by performing the cleaning process according to the above-described embodiment. In the cleaning process, the internal temperature of the process container was set to 300 to 400 degrees C. and the internal pressure of the process container was set to 50 to 100 Torr. A ratio (B/A) of $F_2$ gas flow rate B to FNO flow rate A in a mixture gas was changed within a range from 0 to 1.0. Other process conditions were set to predetermined values within the range of process conditions shown in the above-described embodiment. Then, an etching rate of a deposit including a SiN film adhered in the process container and an etching rate of a quartz member in the process container were measured. In addition, an etching selectivity of the deposit and the quartz member (deposit etching rate/quartz member etching rate) was calculated based on a result of the measurement.

Figure 5:
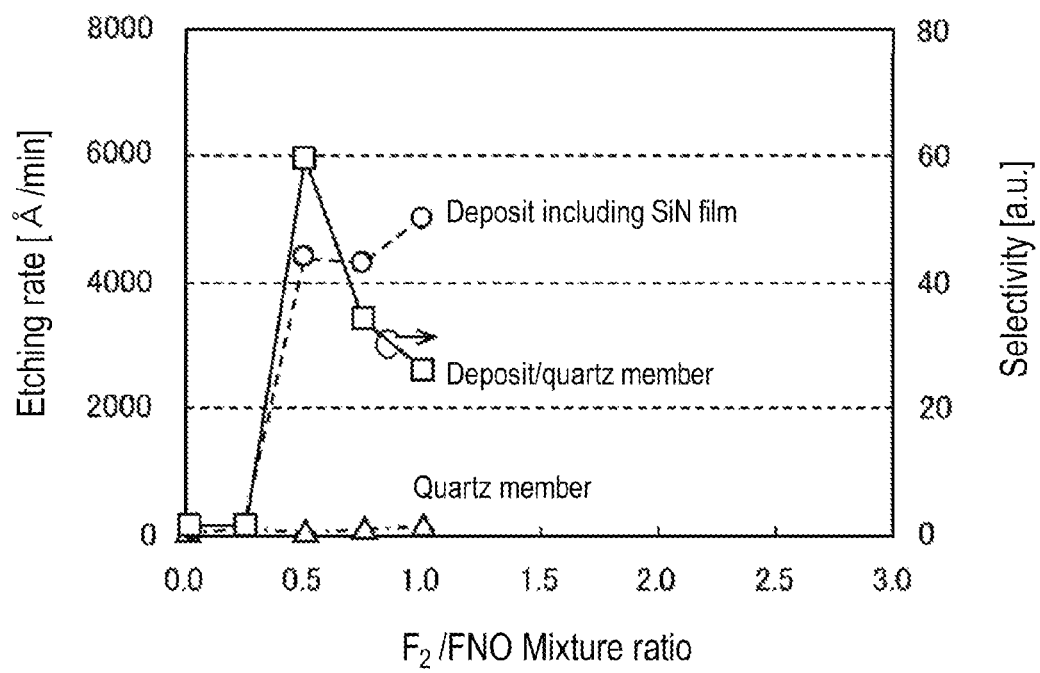
FIG. 5 is a view illustrating results of evaluation on etching rate and etching selectivity for a deposit and a quartz member according to some embodiments.

FIG. 5 is a view illustrating results of evaluation on etching rate and etching selectivity for a deposit and a quartz member according to this embodiment. In FIG. 5, a horizontal axis represents a ratio (B/A) of $F_2$ gas flow rate B to FNO flow rate A, a left vertical axis represents an etching rate [Å/min] and a right vertical axis represents an etching selectivity [a.u.]. In FIG. 5, "○" indicates an etching rate of the deposit, "Δ" indicates an etching rate of the quartz member, and "□" indicates an etching selectivity. "Ratio (B/A)=0" means that a $F_2$ gas supplied into the mixture gas supply pipe is all consumed by reaction and a FNO gas alone is used as a cleaning gas. A larger value of the etching selectivity indicates that it is harder to etch the quartz member, i.e., has a better etching resistance.

It can be seen from FIG. 5 that the ratio (B/A) of 0 provides a low etching rate of the deposit and a low etching selectivity of the deposit and the quartz member. In contrast, it can be seen that the ratio (B/A) of 0.5 or more provides a sharply increasing etching rate of the deposit and a sharply increasing etching selectivity. It can be, however, seen that a higher ratio (B/A) provides a high etching rate of the deposit and a too high ratio (B/A) provides a decreasing etching selectivity. It was also confirmed that a ratio (B/A) of more than 2 provides an etching selectivity lower than a practical use level. It was also be confirmed that a ratio (B/A) of less than 1 allows the etching selectivity to remain relatively high. It was also confirmed that the ratio (B/A) of 0.75 or less allows the etching rate of the deposit and the selectivity to remain relatively high. As can be seen from these results, it is desirable that the ratio (B/A) is set to be equal to or more than 0.5 and equal to or less than 2, more specifically, equal to or more than 0.5 and less than 1, or further more specifically, equal to or more than 0.5 and equal to or less than 0.75.

ASPECTS OF PRESENT DISCLOSURE

Hereinafter, the some aspects of the present disclosure will be additionally stated.
(Supplementary Note 1)
An aspect of the present disclosure provides a cleaning method including: providing a process container in which a process of forming a film on a substrate is performed; and removing a deposit including the film adhered to an interior of the process container by supplying a cleaning gas into the process container after performing the process, wherein the act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.
(Supplementary Note 2)
The act of removing the deposit includes setting a ratio (B/A) of a flow rate (B) of the fluorine-containing gas to a flow rate (A) of the nitrosyl fluoride gas in the mixture gas to be equal to or more than 0.5 and less than 1.
(Supplementary Note 3)
The act of removing the deposit includes setting a ratio (B/A) of a flow rate (B) of the fluorine-containing gas to a flow rate (A) of the nitrosyl fluoride gas in the mixture gas to be equal to or more than 0.5 and equal to or less than 0.75.
(Supplementary Note 4)
The act of removing the deposit includes setting a ratio (B/A) of a flow rate (B) of the fluorine-containing gas left without being consumed by the reaction to a flow rate (A) of the nitrosyl fluoride gas generated by the reaction to be equal to or more than 0.5 and less than 1.
(Supplementary Note 5)
The act of removing the deposit includes setting a ratio (B/A) of a flow rate (B) of the fluorine-containing gas left without being consumed by the reaction to a flow rate (A) of the nitrosyl fluoride gas generated by the reaction to be equal to or more than 0.5 and equal to or less than 0.75.
(Supplementary Note 6)
The act of removing the deposit includes removing the exothermic energy generated by the reaction by cooling the mixture part.
(Supplementary Note 7)
The act of removing the deposit includes removing the exothermic energy generated by the reaction by cooling a gas after the reaction in the mixture part.
(Supplementary Note 8)
The act of removing the deposit includes removing the exothermic energy generated by the reaction by cooling the cleaning gas in the mixture part.
(Supplementary Note 9)
The act of removing the deposit includes generating the mixture gas on-site and supplying the generated mixture gas into the process container.
(Supplementary Note 10)
The fluorine-containing gas includes at least one selected from a group consisting of a fluorine gas, a chlorine fluoride gas, a nitrogen fluoride gas and a carbon fluoride gas.
(Supplementary Note 11)
The fluorine-containing gas includes at least one selected from a group consisting of a fluorine gas and a chlorine fluoride gas.
(Supplementary Note 12)
The fluorine-containing gas includes at least one selected from a group consisting of a nitrogen fluoride gas and a carbon fluoride gas, and the act of removing the deposit includes mixing the fluorine-containing gas after being decomposed and the nitrogen monoxide gas in the mixture part.
(Supplementary Note 13)
The mixture part is configured by a pipe arrangement.
(Supplementary Note 14)
The mixture part is configured by a mixture chamber.
(Supplementary Note 15)
Another aspect of the present disclosure provides a method of manufacturing a semiconductor device, including: performing a process of forming a film on a substrate in a process container; and removing a deposit including the film adhered to an interior of the process container by supplying a cleaning gas into the process container after performing the process, wherein the act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

(Supplementary Note 16)

Another aspect of the present disclosure provides a substrate processing apparatus including: a process container in which a process of forming a film on a substrate is performed; a fluorine-containing gas supply system configured to supply a fluorine-containing gas; a nitrogen monoxide gas supply system configured to supply a nitrogen monoxide gas; a mixture part configured to mix and react the fluorine-containing gas with the nitrogen monoxide gas; an energy removal mechanism configured to remove exothermic energy generated by the reaction; and a control part configured to control the fluorine-containing gas supply system, the nitrogen monoxide gas supply system and the energy removal mechanism to generate a mixture gas of the fluorine-containing gas and a nitrosyl fluoride gas as a cleaning gas by mixture and reaction of the fluorine-containing gas supplied from the fluorine-containing gas supply system and the nitrogen monoxide gas supplied from the nitrogen monoxide gas supply system in the mixture part and supply the mixture gas from the mixture part into the process container after removing exothermic energy generated by the reaction by means of the energy removal mechanism, such that a deposit including the film adhered to an interior of the process container is removed.

(Supplementary Note 17)

Another aspect of the present disclosure provides a program that causes a computer to perform a process of: performing a process of forming a film on a substrate in a process container; and removing a deposit including the film adhered to an interior of the process container by supplying a cleaning gas into the process container after performing the film forming process, wherein the act of removing the deposit includes generating a mixture gas of a fluorine-containing gas and nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

(Supplementary Note 18)

Another aspect of the present disclosure provides a non-transitory computer-readable recording medium storing a program that causes a computer to perform a process of: performing a process of forming a film on a substrate in a process container; and removing a deposit including the film adhered to an interior of the process container by supplying a cleaning gas into the process container after performing the film forming process, wherein the act of removing the deposit includes generating a mixture gas of a fluorine-containing gas and a nitrosyl fluoride gas as the cleaning gas by mixture and reaction of the fluorine-containing gas and a nitrogen monoxide gas in a mixture part and supplying the mixture gas from the mixture part into the process container after removing exothermic energy generated by the reaction.

According to the present disclosure in some embodiments, it is possible to provide a cleaning method which is capable of shortening time required to remove a deposit including a film adhered to an interior of a process container and reducing a damage suffered by components of a substrate processing apparatus, a method of manufacturing a semiconductor device, a substrate processing apparatus and a recording medium.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method for a process container in which a process of forming a film on a substrate is performed, the method comprising:
    removing a deposit including the film adhered to an interior of the process container by supplying a cleaning gas into the process container after performing the process of forming a film,
    wherein the act of removing the deposit includes generating a mixture gas of a fluorine-containing gas and a nitrosyl fluoride gas as the cleaning gas by mixing and reacting the fluorine-containing gas and a nitrogen monoxide gas in a mixture part, removing exothermic energy generated from the reaction of the fluorine-containing gas and the nitrogen monoxide gas by cooling at least one of the mixture part and a downstream side of the mixture part, and supplying the mixture gas from the mixture part into the process container after the cooling, and
    wherein the act of removing the exothermic energy is intended to reduce introduction of particles into or production of particles within the process container that may lead to product defects.

2. The cleaning method of claim 1, wherein the act of removing the deposit further includes setting a ratio (B/A) of a flow rate (B) of the fluorine-containing gas to a flow rate (A) of the nitrosyl fluoride gas in the mixture gas to be equal to or more than 0.5 and less than 1.

3. The cleaning method of claim 1, wherein the act of removing the deposit further includes setting a ratio (B/A) of a flow rate (B) of the fluorine-containing gas to a flow rate (A) of the nitrosyl fluoride gas in the mixture gas to be equal to or more than 0.5 and equal to or less than 0.75.

4. The cleaning method of claim 1, wherein the act of removing the deposit further includes setting a ratio (B/A) of a flow rate (B) of the fluorine-containing gas left without being consumed by the reaction to a flow rate (A) of the nitrosyl fluoride gas generated by the reaction to be equal to or more than 0.5 and less than 1.

5. The cleaning method of claim 1, wherein the act of removing the deposit further includes setting a ratio (B/A) of a flow rate (B) of the fluorine-containing gas left without being consumed by the reaction to a flow rate (A) of the nitrosyl fluoride gas generated by the reaction to be equal to or more than 0.5 and equal to or less than 0.75.

6. The cleaning method of claim 1, wherein the act of removing the deposit further includes generating the mixture gas on-site and supplying the generated mixture gas into the process container.

7. The cleaning method of claim 1, wherein the fluorine-containing gas includes at least one selected from a group consisting of a fluorine gas, a chlorine fluoride gas, a nitrogen fluoride gas and a carbon fluoride gas.

8. The cleaning method of claim 1, wherein the fluorine-containing gas includes at least one selected from a group consisting of a fluorine gas and a chlorine fluoride gas.

9. The cleaning method of claim 1, wherein the fluorine-containing gas includes at least one selected from a group consisting of a nitrogen fluoride gas and a carbon fluoride gas, and the act of removing the deposit includes mixing the fluorine-containing gas after being decomposed and the nitrogen monoxide gas in the mixture part.

10. The cleaning method of claim 1, wherein the mixture part is configured by a pipe arrangement.

11. The cleaning method of claim 1, wherein the mixture part is configured by a mixture chamber.

12. A method of manufacturing a semiconductor device, comprising:

performing a process of forming a film on a substrate in the process container; and removing a deposit including the film adhered to an inside of the process container by supplying a cleaning gas into the process container after performing the process, wherein the act of removing the deposit includes generating a mixture gas of a fluorine-containing gas and a nitrosyl fluoride gas as the cleaning gas by mixing and reacting the fluorine-containing gas and a nitrogen monoxide gas in a mixture part, removing exothermic energy generated from the reaction of the fluorine-containing gas and the nitrogen monoxide by cooling at least one of the mixture part and a downstream side of the mixture part, and supplying the mixture gas from the mixture part into the process container after the cooling, and wherein the act of removing the exothermic energy is intended to reduce introduction of particles into or production of particles within the process container that may lead to product defects.

13. A substrate processing apparatus comprising:

a process container in which a process of forming a film on a substrate is performed;

a fluorine-containing gas supply system configured to supply a fluorine-containing gas;

a nitrogen monoxide gas supply system configured to supply a nitrogen monoxide gas;

a mixture part configured to mix and react the fluorine-containing gas with the nitrogen monoxide gas;

an energy removal mechanism configured to remove exothermic energy generated from the reaction of the fluorine-containing gas and the nitrogen monoxide gas by cooling at least one of the mixture part and a downstream side of the mixture part; and a control part configured to control the fluorine-containing gas supply system, the nitrogen monoxide gas supply system and the energy removal mechanism to generate a mixture gas of the fluorine-containing gas and a nitrosyl fluoride gas as a cleaning gas by mixture and reaction of the fluorine-containing gas supplied from the fluorine-containing gas supply system and the nitrogen monoxide gas supplied from the nitrogen monoxide gas supply system in the mixture part and supply the mixture gas from the mixture part into the process container after removing exothermic energy generated from the reaction by means of the energy removal mechanism, such that a deposit including the film adhered to an interior of the process container is removed, while the energy removal mechanism for removing the exothermic energy is intended to reduce introduction of particles into or production of particles within the process container that may lead to product defects.

14. A non-transitory computer-readable recording medium storing a program that causes a computer to perform a process of:

performing a process of forming a film on a substrate in a process container; and removing a deposit including the film adhered to an interior of the process container by supplying a cleaning gas into the process container after performing the film forming process, wherein the act of removing the deposit includes generating a mixture gas of a fluorine-containing gas and a nitrosyl fluoride gas as the cleaning gas by mixing and reacting the fluorine-containing gas and a nitrogen monoxide gas in a mixture part, removing exothermic energy generated from the reaction by cooling at least one of the mixture part and a downstream side of the mixture part, and supplying the mixture gas from the mixture part into the process container after the cooling, and wherein the act of removing the exothermic energy is intended to reduce introduction of particles into or production of particles within the process container that may lead to product defects.

* * * * *